(12) United States Patent  
Zelenin et al.

(10) Patent No.: US 6,992,609 B1
(45) Date of Patent: Jan. 31, 2006

(54) DIGITAL TO ANALOG CONVERTER

(75) Inventors: Denis Zelenin, Carlsbad, CA (US); Dalius Baranauskas, Pacific Palisades, CA (US)

(73) Assignee: Pulselink, Inc., Carlsbad, CA (US)

( * ) Notice: Subject to any disclaimer, the term of this patent is extended or adjusted under 35 U.S.C. 154(b) by 0 days.

(21) Appl. No.: 10/943,676

(22) Filed: Sep. 17, 2004

(51) Int. Cl.
H03M 1/66 (2006.01)

(52) U.S. Cl. .................. 341/144; 341/153; 341/136

(58) Field of Classification Search ................ 341/155, 341/143, 136, 120, 118, 144, 102, 154; 324/679
See application file for complete search history.

(56) References Cited

U.S. PATENT DOCUMENTS

| | | | |
|---|---|---|---|
| 4,814,740 A * | 3/1989 | Kobayashi .................. 341/118 |
| 4,958,155 A * | 9/1990 | Gulczynski ................. 341/120 |
| 5,059,977 A * | 10/1991 | Herman et al. ............. 341/144 |
| 5,191,242 A * | 3/1993 | Agrawal et al. .......... 326/39 |
| 5,243,347 A * | 9/1993 | Jackson et al. ............. 341/144 |
| 5,343,196 A * | 8/1994 | Harston ...................... 341/136 |
| 5,355,134 A * | 10/1994 | Kasuga et al. ............. 341/144 |
| 5,539,405 A * | 7/1996 | Norsworthy ................ 341/153 |
| 5,592,165 A * | 1/1997 | Jackson et al. ............. 341/143 |
| 5,612,696 A * | 3/1997 | Kim ........................... 341/136 |
| 5,619,512 A | 4/1997 | Kawashima et al. |
| 5,870,043 A * | 2/1999 | Hiromi ....................... 341/120 |
| 5,905,452 A * | 5/1999 | Baek ......................... 341/136 |
| 5,955,980 A * | 9/1999 | Hanna ....................... 341/120 |
| 5,995,031 A * | 11/1999 | Okuda et al. ............... 341/144 |
| 6,019,502 A | 2/2000 | Baeg et al. |
| 6,072,415 A * | 6/2000 | Cheng ........................ 341/144 |
| 6,204,789 B1 | 3/2001 | Nagata |
| 6,225,929 B1 | 5/2001 | Beck |
| 6,317,066 B1 * | 11/2001 | Chiang ....................... 341/144 |
| 6,320,527 B1 * | 11/2001 | Dedic et al. ................ 341/144 |
| 6,320,528 B1 | 11/2001 | Michel |
| 6,329,941 B1 | 12/2001 | Farooqi |
| 6,333,706 B1 | 12/2001 | Cummings et al. |
| 6,335,697 B1 * | 1/2002 | Guyot et al. ................ 341/102 |
| 6,417,793 B1 | 7/2002 | Bugeja et al. |
| 6,448,917 B1 * | 9/2002 | Leung et al. ............... 341/144 |
| 6,557,131 B1 | 4/2003 | Arabi |
| 6,567,942 B1 | 5/2003 | Shepard, III |
| 6,593,868 B2 * | 7/2003 | Clara et al. ................. 341/144 |
| 6,684,350 B1 | 1/2004 | Theodoras, II et al. |

(Continued)

OTHER PUBLICATIONS

Sam Blackman a Professor Bob Brodersen, "A 200 MHz 8-bit Digital-to-Analog Converter", Berkeley Wireless Research Center, Jun. 13, 1999, 8 pages.

(Continued)

*Primary Examiner*—Jean Bruner Jeanglaude
(74) *Attorney, Agent, or Firm*—Pulselink, Inc.; Peter R. Martinez; Steven A. Moore

(57) ABSTRACT

The present invention provides a high speed digital-to-analog converter (DAC), and components for a high speed DAC. One embodiment of the present invention provides a novel current switching circuit that surmounts parasitic capacitance of the circuit elements. In another embodiment, the DAC includes a novel built-in-test circuit, which allows tests of the DAC at high speeds. One feature of the DAC constructed according to the present invention, is that it enables direct digital synthesis of communication waveforms. This Abstract is provided for the sole purpose of complying with the Abstract requirement rules that allow a reader to quickly ascertain the subject matter of the disclosure contained herein. This Abstract is submitted with the explicit understanding that it will not be used to interpret or to limit the scope or the meaning of the claims.

12 Claims, 5 Drawing Sheets

U.S. PATENT DOCUMENTS

| | | | |
|---|---|---|---|
| 6,690,313 B1 * | 2/2004 | Warren et al. | 341/144 |
| 6,768,319 B2 * | 7/2004 | Wang | 324/679 |
| 6,778,119 B2 * | 8/2004 | May | 341/144 |
| 6,781,536 B1 * | 8/2004 | Martins | 341/144 |
| 6,788,234 B2 * | 9/2004 | Aiura et al. | 341/144 |

OTHER PUBLICATIONS

Jack Brown, "SiGe Technology Makes Practical Advances", Microwaves & RF. Special Report Oct. 1999, 4 pages.

Louis E Frenzel, "Wideband Radio Chip Attuned To All Major Wireless interfaces", Electronic Design (www.elecdesign.com Article iD#8820), Nov. 24, 2003, 3 pages.

Jiun-Lang Huang, Chee-Kian Ong & Kwang-Ting Cheng, A BIST Scheme for On-Chip ADC and DAC Testing11, University of California, Santa Barbara, 5 pages, no date.

Federal Communications Commission. in the matter of "Inquiry Concerning the Deployment of Advanced Telecommunications Capability to All Americans in a Reasonable and Timely Fashion, arid Possible Steps to Accelerate Such Development Pursuant to Section 706 of the Telecommunications Act of 1596", OC Docket 98-146. Third Report, Feb. 6, 2002, 11 pages.

Ana Rusu, "Nyquist-Rate Digital-to-Analog Converts", LowPower Analog & Mixed Signal ICs 2004, 82 pages, no month.

Bruno Pattan A Brief Exposure to Ultra-Wideband Signaling, Microwave Journal, 2003 Horizon House Publications, Dec. 2003, 5 pages.

David G Leeper, "Wireless Data Blaster", Scientific American, May 2002, pp. 64-89.

Asish Giann,I Shuo Sheng, Michael S Hsiao & Vishwani D Agrawal, "Novel Spectral Methods for Built-in Self-Test in a System-on-a-Chip Environment", IEEE VLSI Test Symposium, Apr. 2001, pp. 163-168.

Hans-Joachim Wunderuch, "BIST For Systems-On-A-Chip", University of Stuttgart, pp. 1-27, no date.

Professor & Dean Peter (Chung-Yu) Wu, National Chiao Tung University, Course IEE 6736 Analog Integrated Circuit II, Taiwan, Spring 2003, 38 pages.

Gert Jervan, "High-Level Test Generation and Built-in-Self-Test Techniques for Digital Systems", Linkoping University Institute of Technology, Linkoping, Sweden, Oct. 2002, 112 pages.

* cited by examiner

DIGITAL TO ANALOG CONVERTER

FIELD OF THE INVENTION

The present invention generally relates to integrated circuit devices. More particularly, the invention concerns digital to analog converter designs and apparatus.

BACKGROUND OF THE INVENTION

Technology is advancing at an unprecedented pace. For example, access to vast quantities of information through a variety of different communication systems are changing the way people work, entertain themselves, and communicate with each other. As a result of increased telecommunications competition mapped out by Congress in the 1996 Telecommunications Reform Act, traditional cable television program providers have evolved into full-service providers of advanced video, voice and data services for homes and businesses. A number of competing cable companies now offer cable systems that deliver all of the just-described services via a single broadband network.

The wireless device industry has recently seen unprecedented growth. With the growth of this industry, communication between wireless devices has become increasingly important. There are a number of different technologies for inter-device communications. Radio Frequency (RF) technology has been the predominant technology for wireless device communications. Alternatively, electro-optical devices have been used in wireless communications. Electro-optical technology suffers from low ranges and a strict need for line of sight. RF devices therefore provide significant advantages over electro-optical devices.

Conventional RF technology employs continuous sine waves that are transmitted with data embedded in the modulation of the sine waves' amplitude or frequency. For example, a conventional cellular phone must operate at a particular frequency band of a particular width in the total frequency spectrum. Specifically, in the United States, the Federal Communications Commission has allocated cellular phone communications in the 800 to 900 MHz band. Generally, cellular phone operators divide the allocated band into 25 MHz portions, with selected portions transmitting cellular phone signals, and other portions receiving cellular phone signals.

Another type of inter-device communication technology is ultra-wideband (UWB). UWB wireless technology is fundamentally different from conventional forms of RF technology. UWB employs a "carrier free" architecture, which does not require the use of high frequency carrier generation hardware, carrier modulation hardware, frequency and phase discrimination hardware or other devices employed in conventional frequency domain communication systems.

Regardless of the communication technology that is employed, today's consumer is demanding more and more communication speed and functionality. To meet these demands, engineers are pushing the limits of communication technology. For example, high-speed signal converters, such as analog-to-digital converters (ADCs) and digital-to-analog converters (DACs) are essential building blocks in communication technology. By sampling continuous signals, ADCs allow the signals to be processed by digital circuits. Similarly, DACs are used to generate or synthesize continuous signals from digital signals. These synthesized signals may be used as communication waveforms, such as continuous sinusoidal waves for use in conventional RF technology, or the synthesized signals may be in the form of pulses or bursts of energy for use in ultra-wideband communications.

However, many limitations must be overcome when designing very high-speed ADC's and DACs. Precise timing is crucial to these high-speed designs. One class of conventional DACs are known as "switched current source" DACs. This design uses a number of current sources that are switched when the input digital signal changes. This change in current results in a skew of the signal due to the parasitic capacitance inherent in the DAC circuit elements. At high speeds the parasitic capacitance of individual transistors (i.e., circuit blocks) can delay signals, and decrease the functionality of the DAC. Additionally, testing high-speed DACs with modern test procedures and equipment is problematic due to their complexity.

Therefore, there exists a need for apparatus and methods to construct and test converters that address the above problems and limitations.

SUMMARY OF THE INVENTION

The present invention provides a digital-to-analog converter (DAC) circuit for high-speed operation. One embodiment of the present invention provides a novel current switching circuit to assist in overcoming parasitic capacitance of the circuit elements. In another embodiment the DAC includes a novel built-in-test circuit, which allows tests of the DAC at high speeds. While high-speed substrates are preferable, the present invention may be implemented on any suitable substrate.

One feature of the present invention is that because of its speed, it allows for direct digital synthesis of communications waveforms.

These and other features and advantages of the present invention will be appreciated from review of the following detailed description of the invention, along with the accompanying figures in which like reference numerals are used to describe the same, similar or corresponding parts in the several views of the drawings.

Figure 1:
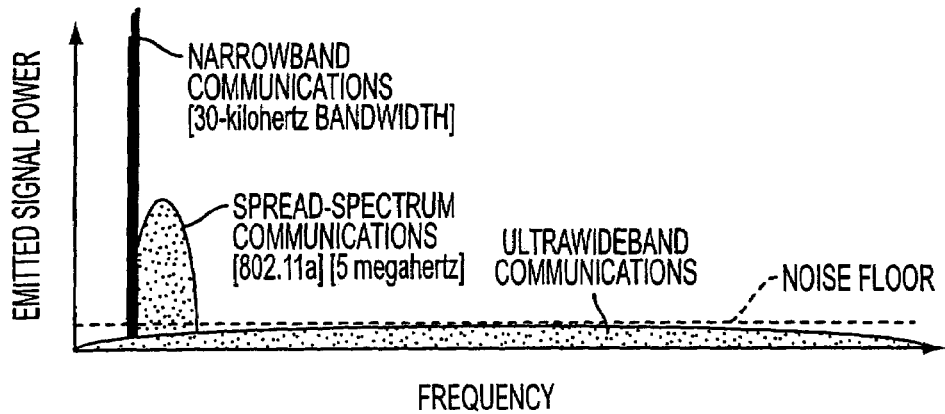
FIG. 1 is an illustration of different communication methods.

It will be recognized that some or all of the Figures are schematic representations for purposes of illustration and do not necessarily depict the actual relative sizes or locations of the elements shown. The Figures are provided for the purpose of illustrating one or more embodiments of the invention with the explicit understanding that they will not be used to limit the scope or the meaning of the claims.

DETAILED DESCRIPTION OF THE INVENTION

In the following paragraphs, the present invention will be described in detail by way of example with reference to the attached drawings. While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. That is, throughout this description, the embodiments and examples shown should be considered as exemplars, rather than as limitations on the present invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

The present invention provides novel improvements in digital-to-analog converter (DAC) circuits. DACs are an important building block in modern circuitry. A DAC takes a digital stream and converts it into an analog signal. That is, a DAC is an electronic circuit that converts digital information (for example, a digital sequence) into analog information, such as a waveform suitable for transmission. One feature of the DAC of the present invention is that it may be used to generate communication waveforms at the same radio frequency used for transmission. Put differently, the DAC of the present invention can generate a radio frequency signal at the frequency used to transmit the signal through the medium of interest, such as the air, wire, cable or other medium. This is in contrast to the output from conventional DACs, which must first be "up-converted" to the radio frequency used for transmission. Using the DAC of the present invention, a transmitter could eliminate oscillators and mixers that are used to up-convert the waveform to the desired radio frequency.

This feature of the present invention is possible because of the high-speed performance of the DAC disclosed herein. The frequency content (i.e., radio frequency range) of the output analog waveform from any DAC is dependent on the speed, or "sampling rate" of the DAC. The "sampling" rate is the interval that measurements (i.e., samples) of a source are taken. According to the well-known Nyquist sampling theorem, an analog waveform may be reconstructed from samples taken at equal time intervals, but the sampling rate must be equal to, or greater than, twice the highest frequency component in the analog waveform. That is, if the highest frequency component in an analog waveform is 5 gigahertz (GHz), then the sampling rate must be at least 10 GHz. For example, one type of communication system transmits at the 5 GHz radio frequency. Therefore, a DAC would need a sampling rate of at least 10 GHz to directly synthesize a 5 GHz signal.

Another important performance parameter of a DAC is its "dynamic range." The dynamic range of a signal generated by a DAC is a function of the number of digital bits the DAC can process. For example, a 12 Giga Sample 6 bit DAC is capable of generating a signal that has a dynamic range of 6 bits, and a frequency range from DC (zero hertz) up to 6 GHz (½ of 12 GHz). One feature of the DAC disclosed herein is that it can generate, or synthesize, communications waveforms at up to 10 GHz (thus capable of sampling at 20 GHz). It will be appreciated that the features and functionalities disclosed herein may be employed by DACs that may be capable of sampling at rates greater than 20 GHz.

There are a number of communications technologies including conventional carrier wave, and ultra-wideband, that may employ a DAC constructed according to the present invention.

Figure 2:
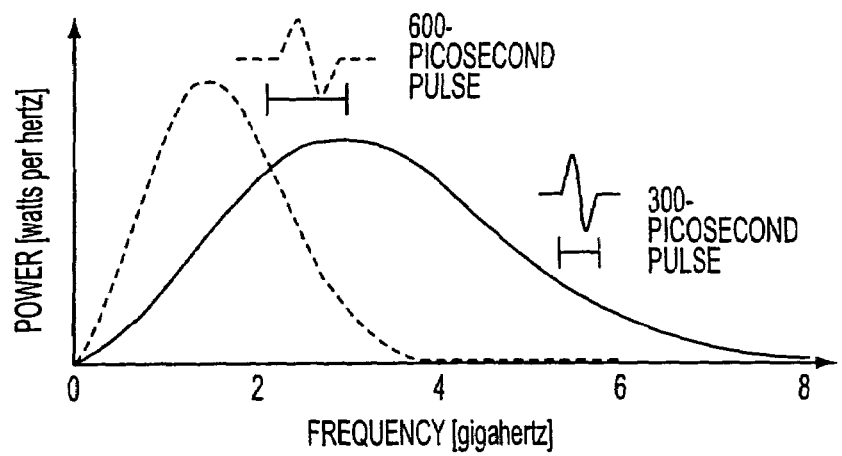
FIG. 2 is an illustration of two ultra-wideband pulses.

Referring to FIGS. 1 and 2, ultra-wideband (UWB) communication employs discrete pulses of electromagnetic energy that are emitted at, for example, nanosecond or picosecond intervals (generally tens of picoseconds to a few nanoseconds in duration). For this reason, ultra-wideband is often called "impulse radio." That is, the UWB pulses may be transmitted without modulation onto a sine wave, or a sinusoidal carrier, in contrast with conventional carrier wave communication technology. UWB generally requires neither an assigned frequency nor a power amplifier.

Alternate embodiments of UWB may be achieved by mixing base band pulses (i.e., information-carrying pulses), with a carrier wave that controls a center frequency of a resulting signal. The resulting signal is then transmitted using discrete pulses of electromagnetic energy, as opposed to transmitting a substantially continuous sinusoidal signal.

An example of a conventional carrier wave communication technology is illustrated in FIG. 1. IEEE 802.11a is a wireless local area network (LAN) protocol, which transmits a sinusoidal radio frequency signal at a 5 GHz center frequency, with a radio frequency spread of about 5 MHz. As defined herein, a carrier wave is an electromagnetic wave of a specified frequency and amplitude that is emitted by a radio transmitter in order to carry information. The 802.11 protocol is an example of a carrier wave communication technology. The carrier wave comprises a substantially continuous sinusoidal waveform having a specific narrow radio frequency (5 MHz) that has a duration that may range from seconds to minutes.

In contrast, an ultra-wideband (UWB) pulse may have a 2.0 GHz center frequency, with a frequency spread of approximately 4 GHz, as shown in FIG. 2, which illustrates two typical UWB pulses. FIG. 2 illustrates that the shorter the UWB pulse in time, the broader the spread of its frequency spectrum. This is because bandwidth is inversely proportional to the time duration of the pulse. A 600-picosecond UWB pulse can have about a 1.8 GHz center frequency, with a frequency spread of approximately 1.6 GHz and a 300-picosecond UWB pulse can have about a 3 GHz center frequency, with a frequency spread of approximately 3.3 GHz. Thus, UWB pulses generally do not operate within a specific frequency, as shown in FIG. 1. Either of the pulses shown in FIG. 2 may be frequency shifted, for example, by using heterodyning, to have essentially the same bandwidth but centered at any desired frequency. And because UWB pulses are spread across an extremely wide frequency range, UWB communication systems allow communications at very high data rates, such as 100 megabits per second or greater.

Also, because the UWB pulses are spread across an extremely wide frequency range, the power sampled in, for example, a one megahertz bandwidth is very low. For example, UWB pulses of one nano-second duration and one-milliwatt average power (0 dBm) spreads the power over the entire one-gigahertz frequency band occupied by the pulse. The resulting power density is thus 1 milliwatt divided by the 1,000 MHz pulse bandwidth, or 0.001 milliwatt per megahertz (−30 dBm/MHz).

Generally, in the case of wireless communications, a multiplicity of UWB pulses may be transmitted at relatively low power density (milliwatts per megahertz). However, an alternative UWB communication system, or impulse radio system, may transmit at a higher power density. For example, UWB pulses may be transmitted between 30 dBm to −50 dBm.

UWB pulses, however, transmitted through many wire media will not interfere with wireless radio frequency transmissions. Therefore, the power (sampled at a single frequency) of UWB pulses transmitted though wire media may range from about +30 dBm to about −140 dBm.

Several different methods of ultra-wideband (UWB) communications have been proposed. For wireless UWB communications in the United States, all of these methods must meet the constraints recently established by the Federal Communications Commission (FCC) in their Report and Order issued Apr. 22, 2002 (ET Docket 98-153). Currently, the FCC is allowing limited UWB communications, but as UWB systems are deployed, and additional experience with this new technology is gained, the FCC may expand the use of UWB communication technology.

The April 22 Report and Order requires that UWB pulses, or signals occupy greater than 20% fractional bandwidth or 500 megahertz, whichever is smaller. Fractional bandwidth is defined as 2 times the difference between the high and low 10 dB cutoff frequencies divided by the sum of the high and low 10 dB cutoff frequencies. Specifically, the fractional bandwidth equation is:

$$\text{Fractional Bandwidth} = 2\frac{f_h - f_l}{f_h + f_l}$$

where $f_h$ is the high 10 dB cutoff frequency, and $f_l$ is the low 10 dB cutoff frequency.

Stated differently, fractional bandwidth is the percentage of a signal's center frequency that the signal occupies. For example, a signal having a center frequency of 10 MHz, and a bandwidth of 2 MHz (i.e., from 9 to 11 MHz), has a 20% fractional bandwidth. That is, center frequency, $f_c = (f_h + f_l)/2$. However, UWB as defined by the present invention is not limited to the current FCC definition. As discussed above, UWB is a form of impulse communications, and may have different characteristics than the current FCC definition.

Figure 3:
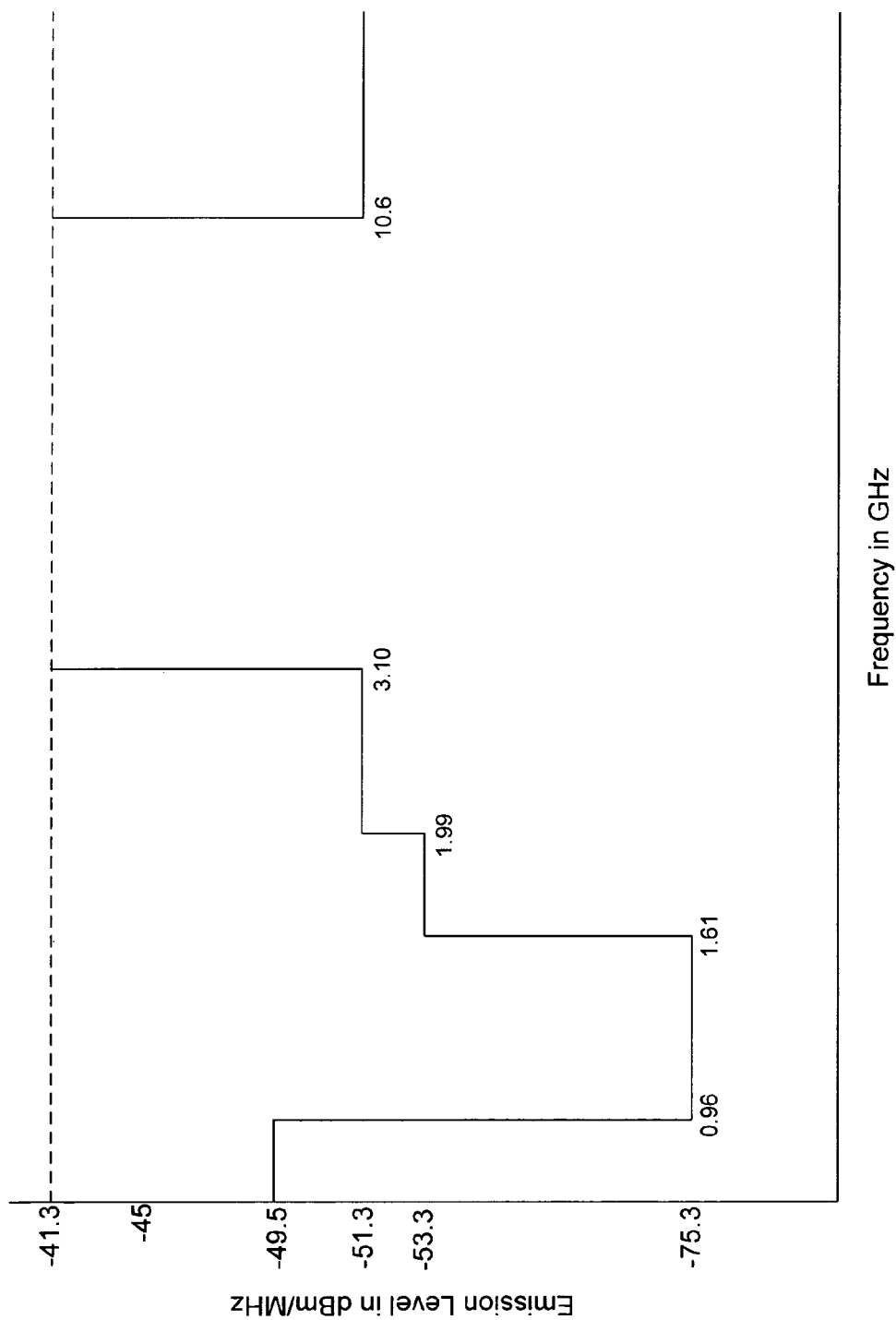
FIG. 3 is a chart of ultra-wideband emission limits as established by the Federal Communications Commission on Apr. 22, 2002.

FIG. 3 illustrates the ultra-wideband emission limits for indoor systems mandated by the April 22 Report and Order. The Report and Order constrains UWB communications to the frequency spectrum between 3.1 GHz and 10.6 GHz, with intentional emissions to not exceed −41.3 dBm/MHz. The report and order also established emission limits for hand-held UWB systems, vehicular radar systems, medical imaging systems, surveillance systems, through-wall imaging systems, ground penetrating radar and other UWB systems. It will be appreciated that the invention described herein may be employed indoors, and/or outdoors, and may be fixed, and/or mobile.

Communication standards committees associated with the International Institute of Electrical and Electronics Engineers (IEEE) are considering a number of ultra-wideband (UWB) wireless communication methods that meet the constraints established by the FCC. One UWB communication method may transmit UWB pulses that occupy 500 MHz bands within the 7.5 GHz FCC allocation (from 3.1 GHz to 10.6 GHz). In one embodiment of this communication method, UWB pulses have about a 2-nanosecond duration, which corresponds to about a 500 MHz bandwidth. The center frequency of the UWB pulses can be varied to place them wherever desired within the 7.5 GHz allocation. In another embodiment of this communication method, an Inverse Fast Fourier Transform (IFFT) is performed on parallel data to produce 122 carriers, each approximately 4.125 MHz wide. In this embodiment, also known as Orthogonal Frequency Division Multiplexing (OFDM), the resultant UWB pulse, or signal is approximately 506 MHz wide, and has a 242 nanosecond duration. It meets the FCC rules for UWB communications because it is an aggregation of many relatively narrow band carriers rather than because of the duration of each pulse.

Another UWB communication method being evaluated by the IEEE standards committees comprises transmitting discrete UWB pulses that occupy greater than 500 MHz of frequency spectrum. For example, in one embodiment of this communication method, UWB pulse durations may vary from 2 nanoseconds, which occupies about 500 MHz, to about 133 picoseconds, which occupies about 7.5 GHz of bandwidth. That is, a single UWB pulse may occupy substantially all of the entire allocation for communications (from 3.1 GHz to 10.6 GHz).

Yet another UWB communication method being evaluated by the IEEE standards committees comprises transmitting a sequence of pulses that may be approximately 0.7 nanoseconds or less in duration, and at a chipping rate of approximately 1.4 giga pulses per second. The pulses are modulated using a Direct-Sequence modulation technique, and is called DS-UWB. Operation in two bands is contemplated, with one band is centered near 4 GHz with a 1.4 GHz wide signal, while the second band is centered near 8 GHz, with a 2.8 GHz wide UWB signal. Operation may occur at either or both of the UWB bands. Data rates between about 28 Megabits/second to as much as 1,320 Megabits/second are contemplated.

A DAC constructed according to the present invention may be employed in any communication device that transmits any of the UWB communication signals described above, or that transmits a conventional carrier wave.

Another feature of a DAC constructed according to the present invention is that it may be used to generate communication signals that include data modulation. Put differently, the traditional method of communications is to generate a signal that will carry data, and then modulate that signal by the data to be sent. However, with a high-speed DAC, such as one consistent with the present invention, the signal can be generated so that it already includes the data (i.e., already modulated). This reduces the complexity of the communications device by eliminating modulation hardware and software.

Any modulation technique may be employed by the DAC of the present invention. One group of modulation techniques may be used to transmit data using a single symbol, or pulse, to represent a plurality of binary digits, or bits. This has an advantage of increasing the data rate in a communications system. A few examples of modulation include Pulse Width Modulation (PWM), Pulse Amplitude Modulation (PAM), and Pulse Position Modulation (PPM). In PWM, a series of predefined widths are used to represent different sets of bits. For example, in a system employing 8 different pulse widths, each symbol could represent one of 8 combinations. This symbol would carry 3 bits of information. In PAM, predefined amplitudes are used to represent different sets of bits. A system employing PAM16 would have 16 predefined amplitudes. This system would be able to carry 4 bits of information per symbol. In a PPM system, predefined positions within the pulse timeslot are used to carry a set of bits. A system employing PPM16 would be capable of carrying 4 bits of information per symbol. Communications systems typically employ more than one modulation technique. This has the potential of vastly increasing the data rate of a communications system.

Another type of modulation method is phase modulation (PM). PM is common in carrier-based communications. Two forms of phase modulation include binary phase shift keying (BPSK) and quadrature phase shift keying (QPSK). In BPSK, the phase of a carrier wave can take two values (0 and 180). A 180-degree phase shift in the carrier could signal a change in the data value. Because BPSK systems use two states (0 and 180 degrees) to modulate data onto the carrier, the system is capable of carrying one bit in each time period. In contrast, QPSK systems modulate data onto the carrier by shifting the phase of the carrier in 90-degree increments. QPSK systems are therefore capable of 2 bits of information during the same time period.

In summary, the DAC of the present invention can directly synthesize or generate any desired communication signal, that may be modulated by any known, or yet to be developed, modulation method.

Virtually all electronic components, such as transistors, have some capacitance. DACs generally include thousands of transistors. Under low speed operation the capacitance of an electronic component is usually not a limitation. Since impedance due to capacitance is a function of frequency, as the speed (i.e., frequency) of a circuit increases, the influence of capacitance becomes more significant. For example, parasitic effects that cause timing delays due to capacitor charging can affect circuit performance. In multi-bit DACs, the timing of currents must be precise. For a fixed capacitance, an increased amount of current can help overcome these, and other, parasitic effects.

The DAC of the present invention employs arrays of current sources. The current sources are not turned on and off but remain on during the operation of the DAC. As the digital input changes from one set of bits to another, the current sources are switched across a resistive load to form an output voltage.

One type of "switched current" DAC architecture uses a number of current sources. The value of current in these sources typically increases by a power of 2 from one current source to another source, with the current sources starting with a base value. For example, if the current base value is I, then the circuit may have sources with values I, 2I, 4I, 8I, 16I, and 32I. In this case any individual current source can be expressed as $I_n = 2^n I$, where I is the current base value.

Figure 4:
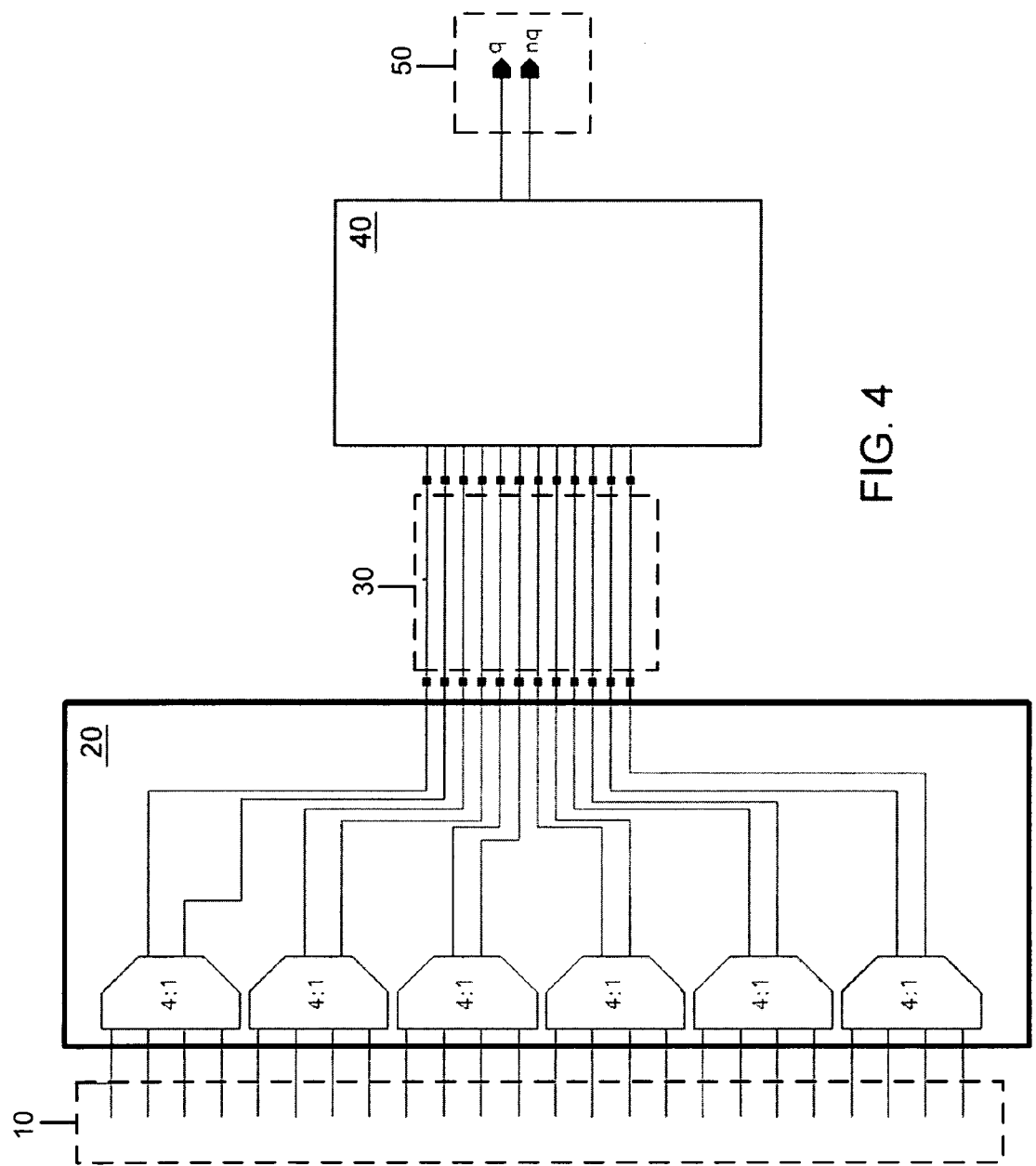
FIG. 4 is an example digital-to-analog circuit consistent with one embodiment of the present invention.

Referring to FIG. 4, a component of a DAC consistent with one embodiment of the present invention is illustrated. A differential parallel data bus 10 is input into multiplexers 20. The differential parallel data bus 10 receives data for processing by the DAC. In this design, the differential parallel data bus 10 can operate at an integer factor of 4 times slower than the DAC because of the 4 to 1 multiplexers 20. Thus, the multiplexers 20 run 4 times faster than the differential data bus 10. For example, if the multiplexers 20 operate at 12 GHz, the differential parallel data bus 10 operates at 3 GHz (¼ of 12), or if the multiplexers 20 operate at 20 GHz, the differential parallel data bus 10 operates at 5 GHz (¼ of 20).

The output from the multiplexers 20 is passed to the high-speed differential data bus 30. The high-speed data bus 30 operates at the same speed as the multiplexers 20. The high-speed data bus 30 sends differential data to the current switching network 40. Current switching network 40 uses the high-speed data bus 30 to form differential analog outputs 50.

Figure 5:
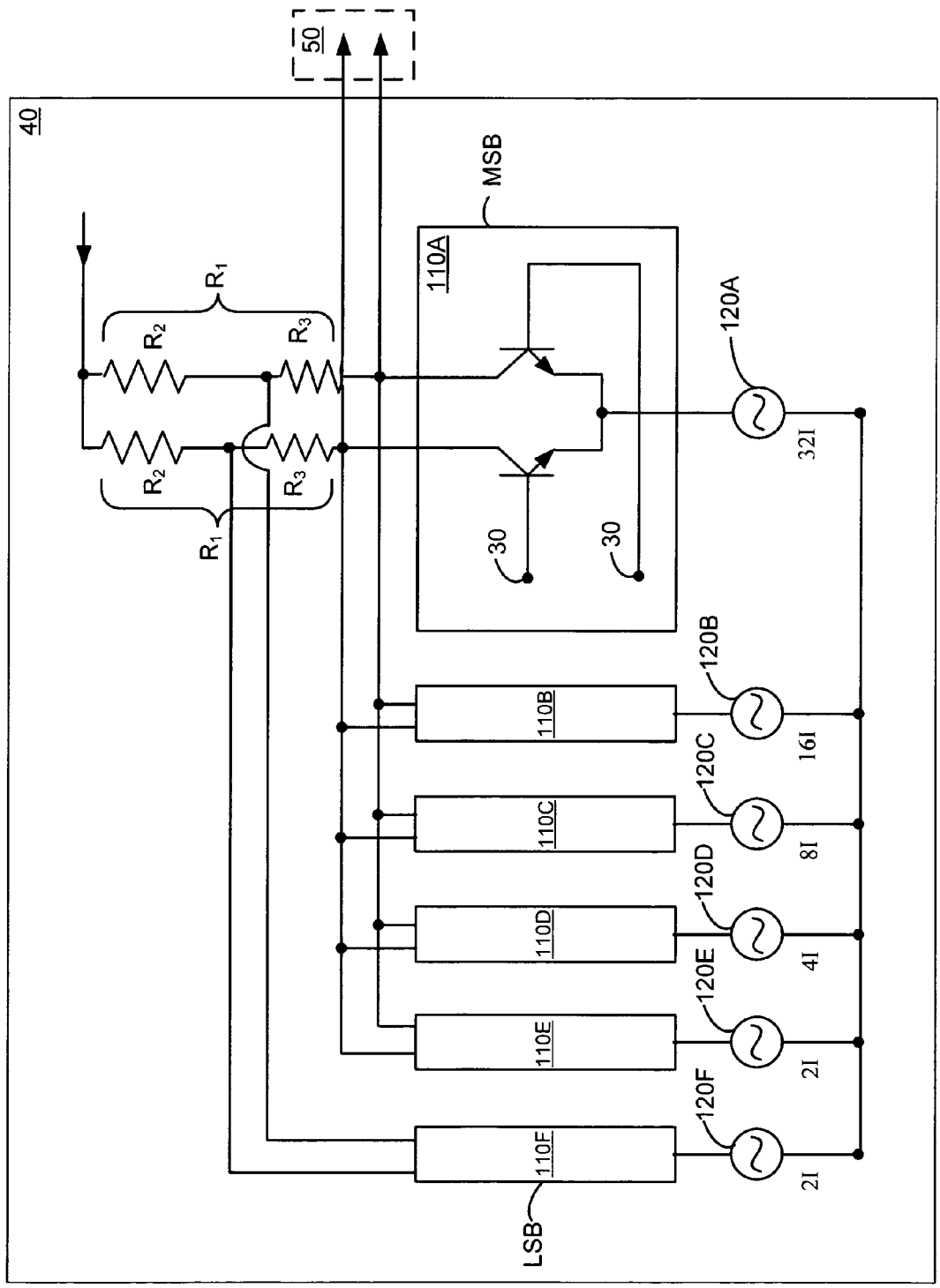
FIG. 5 is an illustration of a current switching circuit consistent with one embodiment of the present invention.

FIG. 5 illustrates the current switching network 40. High speed data bus 30 inputs differential data into a bank of differential pair transistors 110A–F. One pair of inputs from the high speed data bus 30 is shown in differential pair transistor 11A. The other differential pair transistors 110B–F obtain data from the high speed data bus 30 in a similar fashion, but the high speed data bus 30 inputs are not shown for clarity.

The differential pair transistors 110A–F switch or steer current from current sources 120A–F through load resistors R1–R3. The high-speed data bus 30 is connected in order from the most significant bit (MSB) to the least significant bit (LSB), then to the differential pair transistors 11A–F that control switching for current sources 120A–F. For example, the MSB of the high-speed data bus 30 controls the switching of the differential pair transistor 110A connected to the largest current source 120A, which is 32 times the current (32I). Current sources 120A–F are stepped down in value by a factor of 2 moving from MSB to LSB (except at the LSB itself, where current source 120F is the same value as current source 120E, explained below).

In order to minimize the transition time from "on" to "off" for the differential pair transistors 110A–F, the state changing of each of the differential pair transistors 110A–F has to be precisely synchronized. Because of the large range of values provided by each current source 120A–F, which in this embodiment ranges from twice the current (2I) to 32 times the current (32I), and the parasitic capacitor effects, this precise timing is difficult to accomplish.

To achieve this precise timing, the LSB current is not halved with respect to next bit. That is, the current source 120F is the same as current source 120E. However, to achieve the same effect of having the LSB current ½ of the adjacent current (i.e., current of differential pair transistor 110F ½ of the current of differential pair transistor 110E), the load resistor R1 is split to provide the current insertion point between load resistor R2 and load resistor R3. This split of load resistor R1 allows the same output voltage to be developed at differential output 50 that would have been developed if the LSB current had been I instead of 2I. By having the differential pair transistors 110A–F NOT multiples of two of each other, the current spread is minimized, thereby allowing precise synchronization of state changing for all the differential pair transistors 110A–F.

Figure 6:
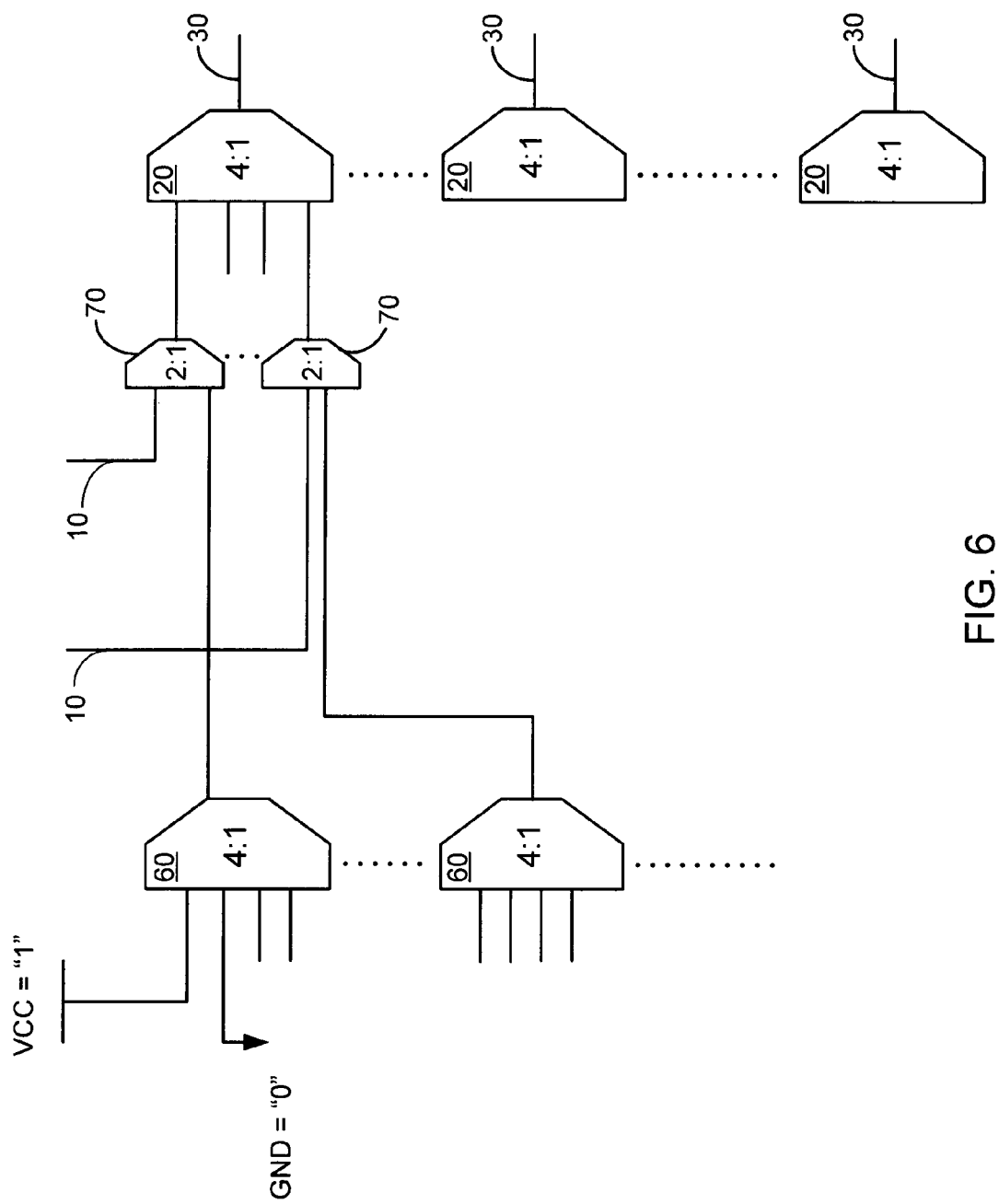
FIG. 6 is an illustration a built-in-test circuit consistent with one embodiment of the present invention.

Referring now to FIG. 6, another feature of a DAC component constructed according to another embodiment of the present invention is illustrated. One step of the DAC manufacturing process is DAC testing, to ensure DAC performance and operation. However, testing of high speed DACs is difficult, as they should be tested with high speed data inputs. This type of high speed data input testing is difficult and expensive. One embodiment of the present invention provides a built-in-self-test (BIST) that may be implemented to generate a predetermined waveform, or simulated high speed data inputs, for quick assessment of DAC functionality without applying incoming data from the parallel data bus 10. In this embodiment, multiplexers 70 are used to route either incoming data from parallel data bus 10, or BIST predefined data from multiplexers 60. The inputs of multiplexers 60 are tied to either a positive voltage reference (VCC), or to ground (GND) to provide either a logic 1 or a logic 0, respectively. By connecting directly to a VCC and ground, the speed that the DAC can be tested can be greatly increased. In another embodiment (not shown) the multiplexers 60 may be replaced with read only memory (ROM), which provides the predetermined data. However, conventional ROMs cannot provide the data at the speed required to test a DAC at its higher speeds. For example, conventional ROMs cannot provide data at the speeds demanded by a 12 GHz or 20 GHz DAC. It will be appreciated that ROM speeds continue to increase, and therefore, they may, at some future time, operate fast enough to provide data at the speeds demanded by a 12 GHz, 20 GHz, or faster DAC.

There are a number of tradeoffs in selection of a substrate for integrated circuit (such as DACs) fabrication. Some substrates, such as Silicon Oxide, are relatively inexpensive to manufacture, but because of their relatively large band gap, and lower electron mobility, may not be appropriate for high-speed circuits. Preferred substrates such as Silicon Germanium (SiGe) or Gallium Arsenide (GaAs) are more complicated and expensive to manufacture, but superior in speed due to lower band gap energies, and higher electron mobility. While the circuit improvements described herein may be used with any appropriate substrate, the preferred embodiment implements these improvements on high-speed substrates such as SiGe or GaAs.

Thus, it is seen that improvements in DAC circuits and DAC components are provided. One skilled in the art will appreciate that the present invention can be practiced by other than the above-described embodiments, which are presented in this description for purposes of illustration and not of limitation. The specification and drawings are not intended to limit the exclusionary scope of this patent document. It is noted that various equivalents for the particular embodiments discussed in this description may practice the invention as well. That is, while the present invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims. The fact that a product, process or method exhibits differences from one or more of the above-described exemplary embodiments does not mean that the product or process is outside the scope (literal scope and/or other legally-recognized scope) of the following claims.

What is claimed is:

1. A digital to analog converter comprising:
    a first data bus;
    a plurality of multiplexers communicating with the first data bus;
    a second data bus communicating with each of the plurality of multiplexers;
    a plurality of switching elements communicating with the second data bus;
    a plurality of resistive circuit elements communicating with a first section of each of the plurality of switching elements;
    a plurality of current sources communicating with the plurality of switching elements;
    wherein a first of the plurality of current sources provides a current value to a first switching element that is approximately equal to a current value provided by a second of the plurality of current sources to a second switching element, and the remaining current sources provide current values that are $2^N$ multiples of the first current value.

2. The digital to analog converter of claim 1, further comprising a built-in self-test circuit communicating with the second data bus.

3. The digital to analog converter of claim 2, wherein the built-in self-test circuit comprises a plurality of multiplexers having a multiplexing ratio of 2 to 1.

4. The digital to analog converter of claim 1, wherein one of the plurality of resistive elements is a series of equal valued resistive elements.

5. The digital to analog converter of claim 1, wherein the first data bus is a differential data bus.

6. The digital to analog converter of claim 1, wherein the second data bus is a differential data bus.

7. The digital to analog converter of claim 1, wherein the first and second data bus operate at different speeds.

8. The digital to analog converter of claim 1, wherein the first data bus operates at a speed from approximately 3 GHz to approximately 5 GHz.

9. The digital to analog converter of claim 1, wherein the second data bus operates at a speed from approximately 12 GHz to approximately 20 GHz.

10. The digital to analog converter of claim 1, wherein each of the plurality of multiplexers has a multiplexing ratio of 4 to 1.

11. The digital to analog converter of claim 1, wherein the plurality of switching elements is a plurality of differential pair transistors.

12. The digital to analog converter of claim 1, further comprising a substrate selected from a group consisting of a silicon oxide substrate, a silicon germanium substrate, and a gallium arsenide substrate.

* * * * *